(12) United States Patent
Aubry et al.

(10) Patent No.: US 12,033,925 B2
(45) Date of Patent: Jul. 9, 2024

(54) PROTECTION OF WIRE-BOND BALL GRID ARRAY PACKAGED INTEGRATED CIRCUIT CHIPS

(71) Applicant: NAGRAVISION S.A., Cheseaux-sur-Lausanne (CH)

(72) Inventors: Pascal Aubry, Cheseaux-sur-Lausanne (CH); Andrew McLauchlan, Cheseaux-sur-Lausanne (CH)

(73) Assignee: NAGRAVISION S.A., Cheseaux-sur-Lausanne (CH)

( * ) Notice: Subject to any disclaimer, the term of this patent is extended or adjusted under 35 U.S.C. 154(b) by 324 days.

(21) Appl. No.: 17/286,709

(22) PCT Filed: Oct. 17, 2019

(86) PCT No.: PCT/EP2019/078247
§ 371 (c)(1),
(2) Date: Apr. 19, 2021

(87) PCT Pub. No.: WO2020/083745
PCT Pub. Date: Apr. 30, 2020

(65) Prior Publication Data
US 2021/0358837 A1  Nov. 18, 2021

(30) Foreign Application Priority Data
Oct. 26, 2018 (EP) .................................... 18202853

(51) Int. Cl.
*H01L 23/498* (2006.01)
*H01L 21/66* (2006.01)
(Continued)

(52) U.S. Cl.
CPC ........ *H01L 23/49816* (2013.01); *H01L 22/14* (2013.01); *H01L 23/5386* (2013.01);
(Continued)

(58) Field of Classification Search
CPC ... H01L 23/552–556; H01L 23/57–576; H01L 27/0288; H01L 27/0259–0262;
(Continued)

(56) References Cited

U.S. PATENT DOCUMENTS

| 2003/0057550 A1 | 3/2003 | Zhao et al. |
| 2007/0007644 A1 | 1/2007 | Zhao et al. |
| 2008/0173996 A1* | 7/2008 | Han ................. G06K 19/07732 257/679 |

(Continued)

FOREIGN PATENT DOCUMENTS

WO  WO 2016/180977 A1  11/2016

OTHER PUBLICATIONS

International Search Report dated Nov. 7, 2019 in PCT/EP2019/078247 filed on Oct. 17, 2019.
(Continued)

*Primary Examiner* — Victor A Mandala
*Assistant Examiner* — Lawrence C Tynes, Jr.
(74) *Attorney, Agent, or Firm* — Oblon, McClelland, Maier & Neustadt, L.L.P.

(57) ABSTRACT

A chip includes a substrate having a first surface and a second surface opposite the first surface, and an integrated circuit mounted on a landing zone on the first surface of the substrate. The chip also includes contacts provided about the first surface in the peripheral region, and wire-bonds providing electrical connections between the integrated circuit and the contacts. The chip further includes solder ball connections provided in the peripheral region on the second surface, and connections provided in the substrate for connecting the electrical contacts on the first surface with the solder ball connections on the second surface. The substrate includes at least one conductive track routed through the landing zone region of the substrate, and the chip is configured such that an alteration in the at least one conductive track prevents operation of the integrated circuit.

6 Claims, 4 Drawing Sheets

(51) Int. Cl.
   *H01L 23/00*      (2006.01)
   *H01L 23/538*     (2006.01)
   *H01L 23/552*     (2006.01)

(52) U.S. Cl.
   CPC ............ *H01L 23/552* (2013.01); *H01L 24/14* (2013.01); *H01L 2224/0401* (2013.01); *H01L 2924/14* (2013.01)

(58) Field of Classification Search
   CPC ..... H01L 2924/3011; H01L 2924/3025; H01L 2924/00012; H01L 2924/15311; H01L 2924/00; H01L 2224/73265; H01L 2224/32245; H01L 2224/48227; H01L 2224/32225; H01L 22/14; B81B 3/0064–0094; B81B 7/0009–0029; B81B 7/0058; B81B 7/0064; B81B 2207/115
   See application file for complete search history.

(56) References Cited

U.S. PATENT DOCUMENTS

| | | | |
|---|---|---|---|
| 2008/0251905 A1* | 10/2008 | Pope | H01L 25/16 257/679 |
| 2009/0057871 A1 | 3/2009 | Zhao et al. | |
| 2010/0276189 A1* | 11/2010 | Song | H01L 23/13 174/262 |
| 2011/0140272 A1 | 6/2011 | Zhao et al. | |
| 2013/0312123 A1* | 11/2013 | Chyan | G06F 21/70 726/34 |
| 2018/0102643 A1 | 4/2018 | Aubry et al. | |

OTHER PUBLICATIONS

Extended European Search Report dated Mar. 7, 2019 in European Patent Application No. 18202853.0 filed on Oct. 26, 2018, 7 pages.

* cited by examiner

PROTECTION OF WIRE-BOND BALL GRID ARRAY PACKAGED INTEGRATED CIRCUIT CHIPS

FIELD

The present invention relates to an integrated circuit chip protected against physical and/or electrical alterations and more specifically is directed at protecting integrated circuits which are packaged in a wire-bond ball grid array form of package.

TECHNICAL BACKGROUND

Integrated circuit (IC) chips are often subjected to physical attacks, such as live hardware analysis, aimed at gaining knowledge of the internal functioning of the chip and consequently influencing the operation of the chip.

During such an attack, the plastic housing protecting the chip against mechanical damage may be opened on its top face to reveal a passivation layer covering the electronic circuitry.

The passivation layer may be selectively removed by etching methods using mechanical polisher or chemical means to allow access to the signal lines.

Live hardware analysis techniques may be performed on integrated circuit chips during their operation, whereas other techniques such as reverse engineering, which is aimed at analyzing and reconstructing the operation of the chip, usually result in the destruction of the chip.

Techniques of attack have also been developed using fault injection. In fault injection, a local energy source, for example a laser can be used to alter the behaviour of the integrated circuit.

Similarly, techniques of attack are known which allow localized side-channel analysis to be performed using a precise probe to measure the electromagnetic emanations from within the integrated circuit.

These techniques or a combination of them may be used to extract secrets stored within an integrated circuit chip.

An analysis of the integrated circuit chip is usually undesirable. Live hardware analysis should be prevented, if possible, particularly in the case of secure circuits such as a microprocessor including an electronic wallet function or the like. In practice, various methods already exist to render such an analysis more difficult.

Physical attacks of all or parts of the chip may be prevented by so-called active or passive shields.

A passive shield comprises metallic planes or tracks connected to a circuit configured to perform analogue integrity measurements in order to detect cuts, short circuits or capacitive load variations for example. In an active shield, there may be a plurality of tracks in which random bit sequences are injected and checked for conformity from one end of a track to another.

Integrated circuit chips are supplied in a variety of different package types which allow connection from the integrated circuit chip to the external world via electrical connections provided external to the package. These connections may for example be pins, pads or solder balls.

One known type of package is that of ball grid array (BGA). In a BGA, a plurality of solder balls are provided on one surface of the package to provide connections from the integrated circuit chip to the external world.

For simplicity, the surface of the package which has the solder balls shall be referred to hereinafter as the bottom surface of the package.

Internally within the BGA package connections are made to the integrated circuit. Depending on the manner of connection, a BGA package is considered as either a wire-bond or flip-chip BGA.

The present application is directed at wire-bond BGA packages. As may be seen in the exemplary cross-section of FIG. 1, in a wire-bond BGA package 1, the integrated circuit 2, is mounted on a substrate 8.

The integrated circuit is provided on a landing zone 22 which is an area on a surface of the integrated circuit. The region of the substrate defined by the outline of the landing zone may be referred to as the landing zone region. The landing zone region is typically, but not always, a landing zone region of the substrate. The landing zone may have a metal base pad 12, to which the integrated circuit may be mounted using an adhesive. This metal base pad may form part of a ground plane or there may be a separate layer providing a ground plane in the landing zone region.

Solder ball connections 10 are provided on the bottom surface of the package to make external connections from the package. Wire-bonds 4 connect the integrated circuit to pads 16 on the top surface of the substrate. The pads 16 are arranged in a peripheral region of the substrate surrounding the landing zone region. The pads in turn connect by tracks and interconnects 15 to tracks on the underside which in turn connect to pads with the individual solder balls. As may be seen in FIG. 2, the solder balls providing signal connections (as with the corresponding tracks, interconnects and pads) are preferably positioned in the peripheral region 28 surrounding the landing zone region 22 of the substrate where the die is positioned.

To facilitate more complex and denser connections the substrate may have a plurality of layers 18 (shown as dashed lines) providing tracks to facilitate connections between wire-bonds on the top surface and the underlying solder balls.

Conventionally, the integrated circuit is provided with a plastic moulded shell 6 to provide mechanical protection. To help with heat transfer from the integrated circuit, thermal vias 14 may be provided to transmit heat through the substrate. These thermal vias may also provide an electrical connection between the ground pane and the underside of the substrate. These thermal vias are conventionally positioned about the landing zone region so as to ensure heat transfer from the metal pad 12 underlying the die.

In some configurations there are no solder balls provided in the landing zone region 22 of substrate underlying the integrated circuit. In other configurations, solder balls are provided in the landing zone region. Where solder balls are provided in the landing zone region, they are generally connections to ground. At the same time, power connections may be grouped together extending from the corners of the landing zone region and may be commonly connected to a power plane.

The metal base pad may be a ground plane or there may be a separate ground plane underneath the metal base pad 12. Similarly, one or more power planes may be provided on other layers of the substrate. It will be appreciated that a ground or power plane is conventionally a substantially contiguous area of conductive material in a layer which extends to cover the landing zone region. Ground and power planes are generally desirable to improve power transfer and to reduce problems such as noise.

The present application is directed at improving the security of integrated circuit chips which are packaged as wire-bond BGAs.

SUMMARY

The present application is directed at protecting against an attack which has not previously been identified as possible.

In particular, it has been identified that localized electromagnetic side-channel or targeted laser fault attacks as described above which require close proximity to the integrated surface may be employed against BGA packages.

In this respect, for both of these techniques targeting the substrate of the IC is preferred as, combined with thinning, it allows access to the transistors within without the shielding effect (either electromagnetic or physical) of the IC metal layers used for routing signals and supplying power.

In the case of flip-chip packages, the substrate is available directly.

In the case of wire-bond BGA packages, the substrate was believed to provide protection. However, it is now realised that the conventional approach of efficient routing of signals within the BGA package, including grouping of power and ground connections introduces a vulnerability.

In particular, it can leave large areas of the substrate accessible even where large parts of the power domains' (ground and supply voltages) routing are removed, using a milling step 30 as demonstrated in FIG. 3. The opening provided by such a milling step through the landing zone region allows for access to large sections of the substrate of the integrated circuit.

Thus the present application provides a counter intuitive approach which negates the conventional wisdom and deliberately seeks to provide protective tracks in the landing zone region which are required for the proper operation of the integrated circuit and whose breaking would render the integrated circuit chip inoperable. Suitably these protective tracks are not ground or power tracks but instead are signal tracks for providing a signal to or from the integrated circuit.

Accordingly, the present application provides for a wire-bond ball grid array packaged integrated circuit chip in which a critical connection other than power or ground is routed through the substrate of the package under the integrated circuit.

More particularly, according to a first embodiment, a chip according to claim 1 is provided as well as a method according to claim 4 for protecting a chip against attack.

Accordingly, a first embodiment provides a chip comprising a substrate having a first surface and a second surface opposite the first surface. An integrated circuit is mounted on a landing zone of the first surface of the substrate, the landing zone defining a landing zone region of the substrate. A plurality of contacts are at least provided on the first surface in a peripheral region surrounding the landing zone region. A plurality of wire-bonds provide electrical connections between the integrated circuit and the plurality of contacts. A plurality of solder ball connections are provided in the peripheral region of the second surface with a plurality of connecting tracks provided in the substrate for connecting the electrical contacts on the first surface with the solder ball connections on the second surface. The chip comprises additionally at least one protective track routed through the landing zone region of the substrate, wherein the chip is configured such that an alteration in the at least one protective track prevents operation of the integrated circuit.

A ground plane may be provided as a layer of conductive material in the landing zone region of the substrate and the at least one protective track may follow an isolated path partitioning the ground plane layer.

Similarly, a power plane may be provided as a layer of conductive material in the landing zone region of the substrate and the at least one protective track may follow an isolated path partitioning the power plane.

The at least one protective track may be electrically connected to at least one solder ball positioned in the landing zone region of the substrate.

The at least one protective track suitably provides an electrical connection to the integrated circuit which is required for the correct operation of the integrated circuit.

The at least one protective track may be a security track. This security track may in turn form part of a security mechanism which is configured to detect an interference with the integrity of the security track.

Such a security mechanism suitably further comprises a signal transmitter on the integrated circuit for providing a signal to a first end of the security track; and a detection circuit connected to a second end of the security track for detecting an alteration to the signal. The detection circuit can detect an interruption of the security track or a modification of the characteristic signal at the second end of the track such as attenuation or variation of impedance.

Suitably, the security mechanism may further comprise a response circuit responsive to the detection circuit for causing the performance of the at least one counter measure. The at least one countermeasure may comprise resetting or disabling all or part of functionality of the chip. This resetting may include the erasing of contents of memory on the integrated circuit.

In a further embodiment a method for protecting a wire-bond packaged ball grid array chip against alterations is provided. The method suitably comprises the steps of forming a substrate having a first surface and a second surface opposite the first surface having a landing zone for an integrated circuit, the landing zone defining a landing zone region of the substrate, the forming of the substrate including providing a plurality of contacts about the first surface in a peripheral region, the peripheral region surrounding the landing zone region;

mounting the integrated circuit on the landing zone;

connecting a plurality of wire-bonds between the integrated circuit and the plurality of contacts;

providing a plurality of solder ball connections on a peripheral region of the second surface and wherein the step of forming the substrate include providing a plurality of conductive tracks in the substrate for connecting the electrical contacts on the first surface with the solder ball connections on the second surface.

The forming of the substrate suitably comprises routing at least one protective track through the landing zone region of the substrate, wherein the chip is configured such that an alteration in the at least one protective track prevents operation of the integrated circuit.

The method may comprise the step of forming a layer of conductive material in the landing zone region of the substrate to act as a ground plane wherein the at least one track follows an isolated path partitioning the ground plane.

The method may comprise providing a layer of conductive material in the landing zone region of the substrate to act as a power plane and the at least one track follows an isolated path partitioning the power plane.

The method may comprise the step of forming a conductive path using the at least one conductive track between one of the landing zones and at least one solder ball, wherein the at least one solder ball is positioned in the landing zone region of the substrate.

The at least one protective track may provide an electrical connection to the integrated circuit which is required for the subsequent correct operation of the integrated circuit.

The at least one protective track may be a security track forming part of a security mechanism. The method may further comprise providing a detection circuit in the integrated circuit as part of the security mechanism for detecting any interference with the security track. In which case, the detection circuit is configured to cause a response circuit to enable countermeasures. The countermeasures may comprise resetting or disabling all or part of functionalities of the chip.

BRIEF DESCRIPTION OF THE DRAWINGS

The present application will now be described with reference to the accompanying drawings in which.

DETAILED DESCRIPTION OF THE DRAWINGS

As discussed above a vulnerability to attack has been identified in wire-bond BGA packages and the present application provides an inexpensive method to frustrate such attempts.

Figure 1:
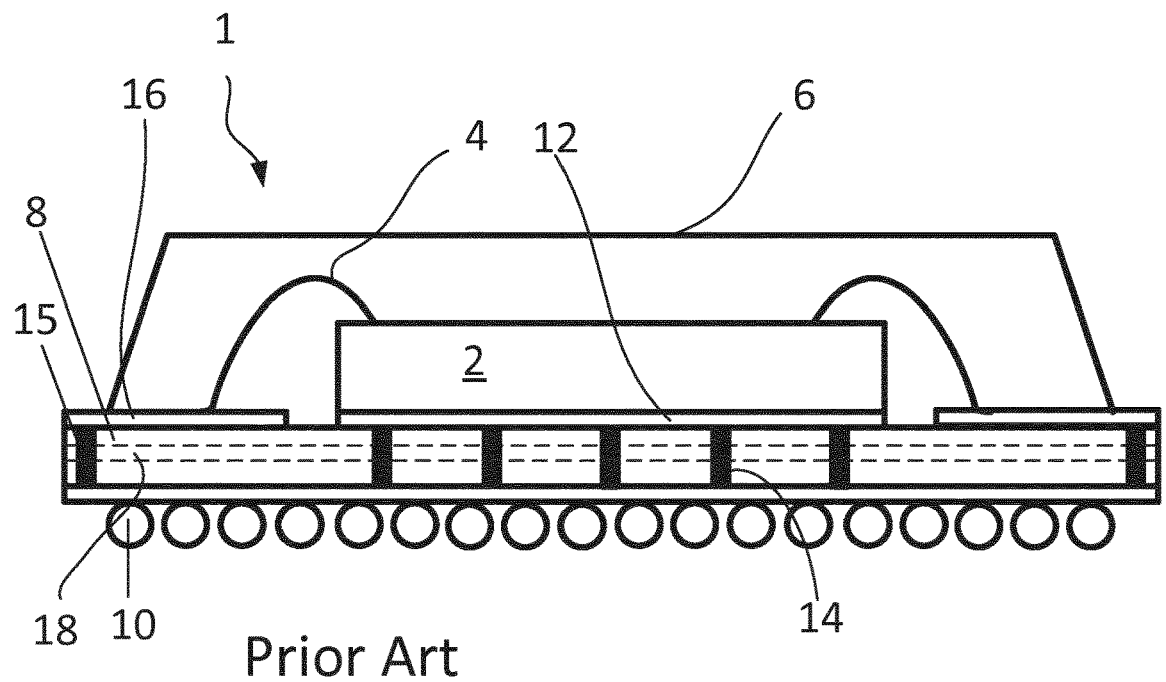
FIG. 1 is a cross sectional view of a wire-bond BGA package known in the art.
Figure 2:
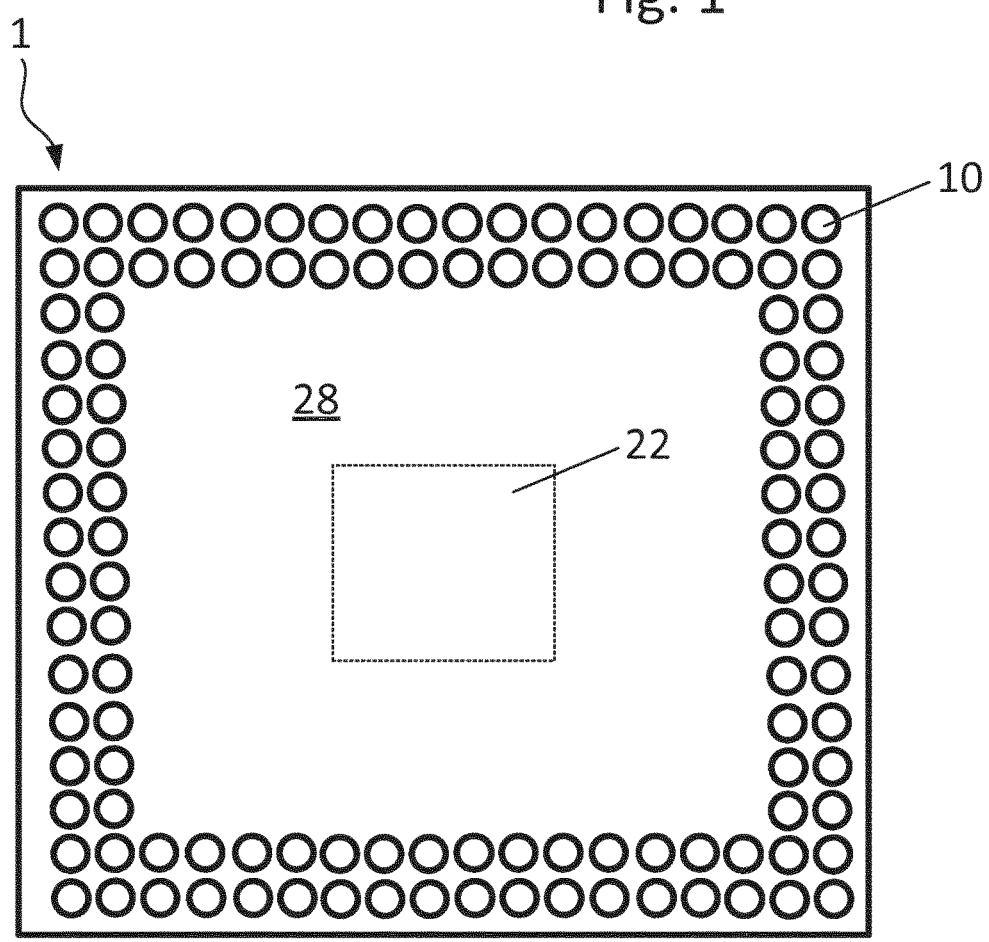
FIG. 2 is a bottom view of the package of the type generally shown in FIG. 1.
Figure 3:
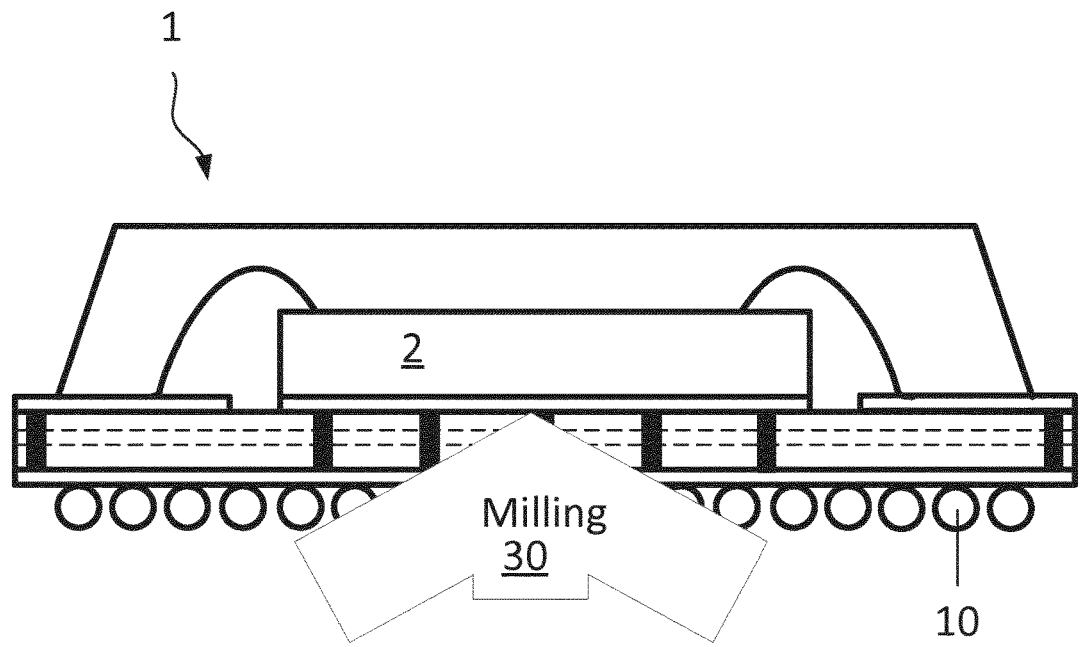
FIG. 3 is an illustration of a potential route of attack to the substrate of the package of FIG. 1.
Figure 4:
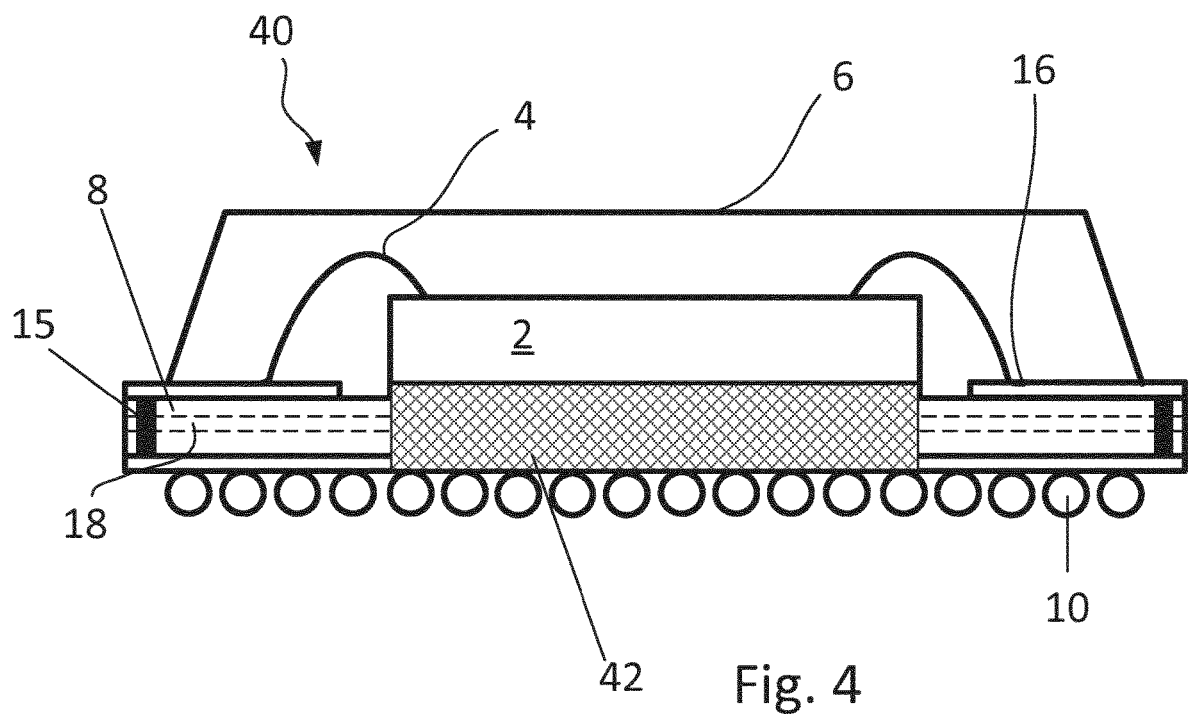
FIG. 4 is an illustration highlighting a region in which a protective measure may be provided in a wire-bond BGA package to reduce the opportunity for attack by the means shown in FIG. 3.

As shown in FIG. 4, the present application provides a wire-bond packaged ball grid array, BGA. chip 40 in which protective measures are employed in the region 42 of the substrate 8 underneath the integrated circuit die. For the avoidance of repetition, like features with the prior art of FIG. 1, employ the same reference numerals.

It will be appreciated that the protective measures are applied during the creation of the BGA package for the package and more particularly during the formation of the substrate as well as in the design of the chip.

The protective measures are based upon forcing physical destruction of one or more protective tracks during the opening, by milling or otherwise of the chip's package from the solder ball side to gain access to the die.

Conventionally opening up of large sections of the landing zone region under the die is possible as there is significant redundancy provided for power and ground connections and thus a large portion of the region under the die can be removed with limited effect on the operation of the integrated circuit thus opening the die to attack.

More specifically, BGA wire-bonded packages are typically routed to provide the most efficient pin-outs, with power and ground balls arranged about and within the landing zone region of the package (underneath the chip). This also allows heat dissipation into the large GND plane. Typically, these power and ground planes are re-connected at multiple points between PCB layers. It is the large area and the multiple connections that allows large areas to be opened beneath the silicon of the die without any effect on functionality.

The present application places protective connections (protective tracks) through the vulnerable landing zone region 42. The substrate will then comprise connecting tracks for the normal operation of the chip and connecting a solder ball to the electrical contacts on the first surface as well as protective tracks, not used to convey a signal from or to the chip from the solder ball but to detect an intrusion into the landing zone. For that purpose, at least a part of the protective track is situated within the landing zone.

Connecting tracks (also known as traces) would be familiar to those in the art. Generally, the length of a track is an order of magnitude, for example at least ten, times their width.

In this context, the protective tracks suitably start at a point outside the landing zone region. It will be appreciated that protective tracks run parallel to the surfaces of the substrate. This is in contrast to connecting tracks which run substantively perpendicular to the surfaces such as vias which are employed conventionally to connect the ground plane to solder balls below. The protective tracks may be provided in one or more layers of the substrate. In certain configurations, the protective track will end at a point outside the landing zone region, for example where it is a security track and a connection is made to a detector on the integrated circuit. In other configurations, the protective track will terminate at a point within the landing zone region and an external electrical connection will be made to the second via a solder ball connection (as will be described below).

The physical destruction or interference with of one or more of the protective tracks can either disable connectivity and thus the functionality of the chip or where the track is a security track allow detection and action by a security mechanism of the IC.

The security mechanism may employ active or passive shield techniques (referenced above and described below) which would be known to those skilled in the art.

By routing one or critical signals directly underneath the silicon substrate through the power and/or ground planes, this limits the area which can be opened without having to reconnect these signals and the ground and power planes.

It will be appreciated that the more critical signals that are routed through the landing zone region, the more unfeasible it is to reconnect multiple cut signals during an attack.

The signals routed through the landing zone region are selected to be suitably critical to the operation of the chip.

In a first approach, the critical nature may be directly, i.e. that the signal routed along a conductive track in the landing zone region is required for the normal functioning (correct operation) of the integrated circuit. As an example, in may be an input or output signal connection from the integrated circuit. It will be appreciated that a signal connection is distinct from a power connection, i.e. a ground or a supply voltage.

In a second approach, the critical nature is indirect. In this approach, the conductive track is a security track (or protective track) which forms part of a security mechanism. The security mechanism is not required for normal operation of the integrated circuit and does not generally interfere in the operation of the integrated circuit unless and until it detects an attack on the integrity of the security track.

It will be appreciated that the two approaches are not mutually exclusive. Both may be employed at the same time using different tracks.

At the same time, by providing tracks in the same layer as the ground plane or a power plane, the GND and power domains are suitably less interconnected as the contiguous area of the planes may be segmented thus creating more opportunity to isolate critical circuitry/detector circuits. Where the tracks are provided in a different layer to the GND or power domains, the tracks still reduce the contiguous area available for attack by limiting the space available to be opened.

As shown in FIG. 4, an integrated circuit die 2 is positioned and mounted generally on top of a substrate 8. The outline or perimeter of the die defines an area, referred to as a landing zone, which in tune defines a landing zone region of the substrate 8 which extends between the two surfaces and is defined by the area of the landing zone. Wire-bonds 4 connect the top of the die to contacts 16 on a first surface of the substrate. These contacts 16 are arranged in a peripheral region of the substrate surrounding the landing zone region 22. Solder ball connections 10 are provided on the second side of the substrate.

Through connections, for example via 15, are provided to electrically connect individual solder ball connections to associated contacts on the top surface.

To hinder attack through the landing zone region of the die at least one conductive track is routed through the landing zone region 42 of the substrate. The at least one track does not form part of a ground or power plane. The conductive track may be co-planar with one or other of a ground or power plane. The chip is configured such that an alteration in the at least one conductive track prevents operation of the circuit.

Several potential approaches to routing critical paths through the landing zone region, which may be used in isolation or combined together, will now be described with reference to FIGS. 5 to 7.

Figure 5:
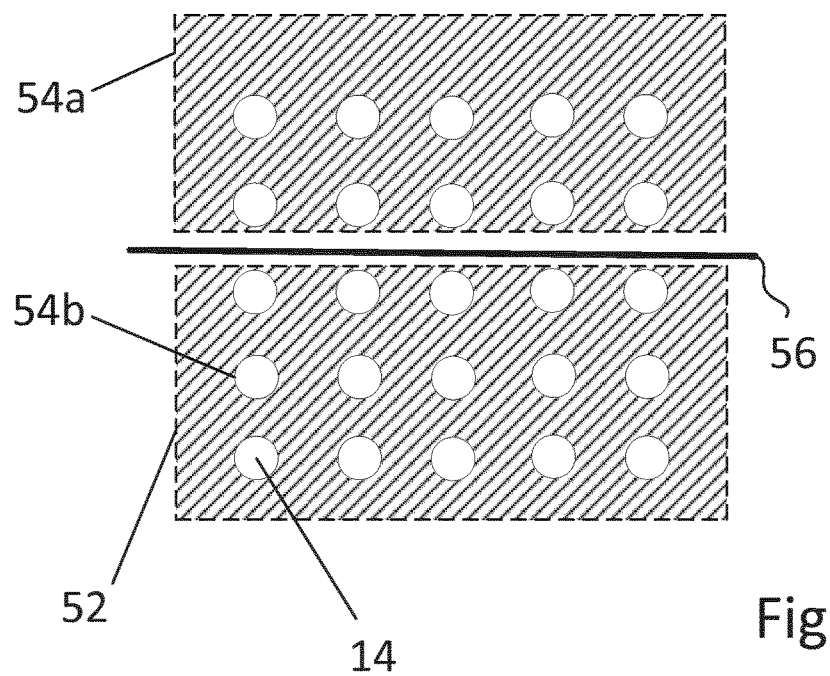
FIG. 5 is an exemplary arrangement illustrating how a conductive plane may be partitioned.

In FIG. 5, a ground plane 52 which is provided in the landing zone region of the substrate is shown. A plurality of thermal vias 14 are provided which provide both thermal and electrical connections to the ground plane from solder balls (not shown) on the underside of the substrate. For convenience, regions of the plane extending beyond the landing zone region defined by the position of the die are not shown. In practise, connections will extend from the landing zone region to contact pads onto which wire bonds will make connections to the die. Generally, there will be multiple different ground and power connections arranged to the die.

Thus, in a conventional approach, ground connections may be made to conductive tracks along the exterior sides of the landing zone region with power connections in the regions adjacent to and exterior the corners of the landing zone region.

A conductive track 56 which is insulated from but coplanar with the ground plane follows an isolated path through the ground plane. This isolated path separates the ground plane into two separate contiguous areas 54a and 54b. The conductive track is connected through a contact pad and wire-bond on one side. In a first approach, the conductive track is employed as part of an active or passive shield and is connected by a second contact pad and wirebond to the integrated circuit and forms part of a detection circuit which is configured to monitor for any alteration in the protective track.

In a second approach, the conductive track provides a connection to a required signal (a critical connection) on the integrated circuit and the second end of the conductive track is connected by means of a via to a solder ball connection at the bottom of the substrate. Thus a critical signal connection is routed through the landing zone region whose interruption prevents the correct operation of the integrated circuit.

At the same time, it will be appreciated that the separation of the ground plane into two separate ground plane areas 54a and 54b again limits the scope of removing material to access the substrate of the die.

It will be appreciated that the number of conductive tracks may be increased to increase the complexity and the necessity to bypass and re-establish connections. Thus, in FIG. 6, the ground plane 62 is partitioned into four separate contiguous areas 64a, 64b, 64c, 64d by two separate conductive tracks 66, 67 each of which may be one or other of a critical signal for the operation of the circuit or connected to a detection circuit. It will be appreciated that the approach is not restricted to two conductive tracks.

Figure 6:
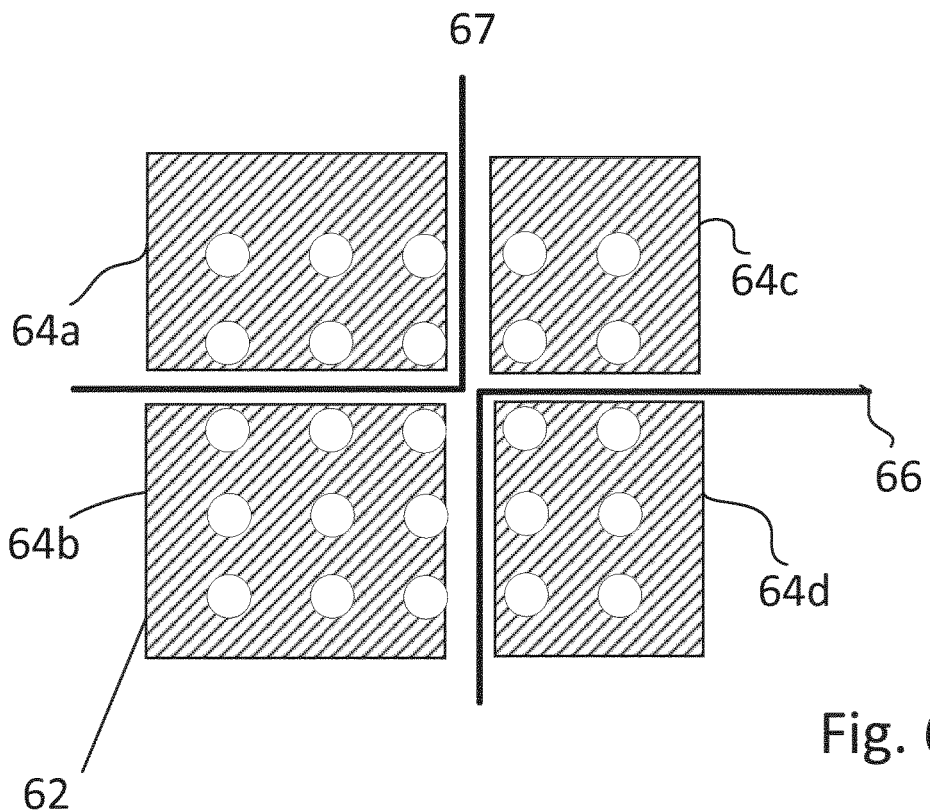
FIG. 6 is a further exemplary arrangement illustrating partitioning of the conductive plane.

Although, FIGS. 5 and 6 are referenced in the context of a ground plane, it will be appreciated that it equally may be applied to a power plane. In the case of a power plane, it is likely that the thermal vias would be isolated from the plane as thermal vias are conventionally ground connections.

Figure 7:
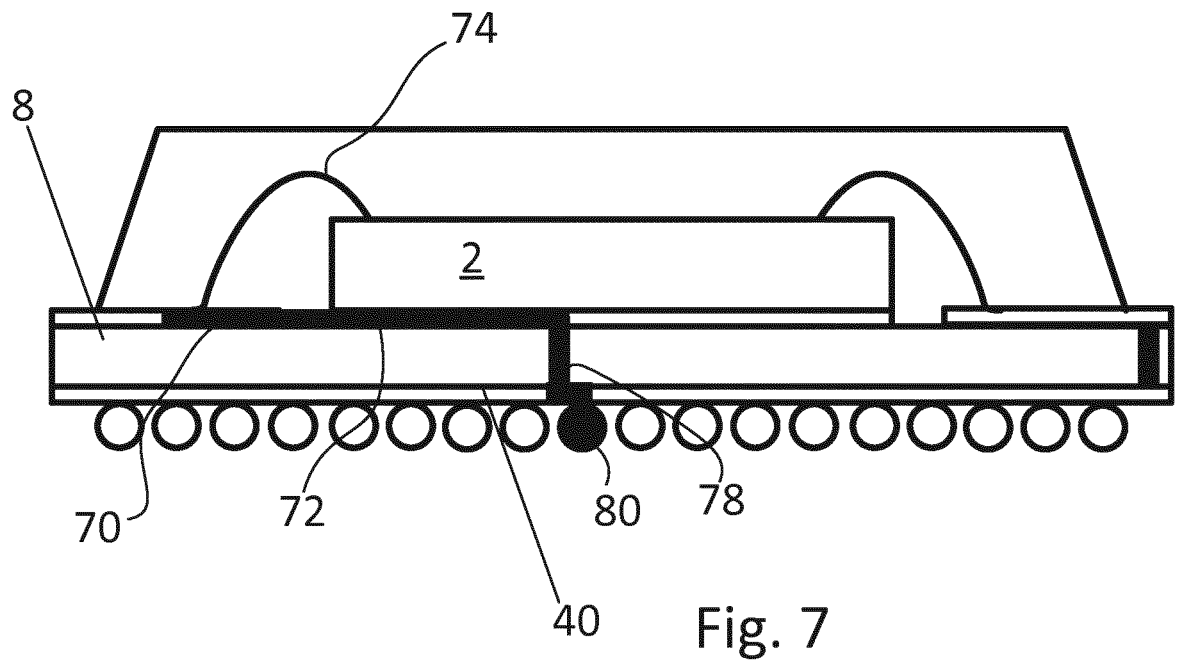
FIG. 7 is a further exemplary arrangement in which a solder ball connection to a critical signal is provided to reduce the opportunity for attack by the means shown in FIG. 3.

A further approach to protecting the vulnerable region is shown in FIG. 7, in which a wire-bond connection 74 is made to a conductive pad 70 on the top surface of the substrate. As is conventional, the conductive pad 70 is located in the peripheral region surrounding the landing zone region of the die. The conductive pad is for a signal connection rather than a ground or power connection to the integrated circuit.

The conductive pad is connected by means of a conductive track 72 into the landing zone region of the die where a via 78 provides a connection to the underside of the substrate and where in turn an electrical connection is made to a solder ball 80. The solder ball 80 is provided in the landing zone region of the substrate directly under the die. It will be appreciated that the conductive track may be positioned in a layer coplanar with a ground plane, power plane or be in an intermediate layer. Equally, the conductive path between the contact pad and the solder ball may include additional vias or tracks in different layers of the substrate.

By positioning one or more solder ball connections centrally under the die for critical signals other than power or ground connections, the vulnerability of the chip to attack through the identified vulnerable region is significantly reduced. It will be appreciated that this approach runs entirely counter intuitive to the design of wire-bond BGA packages where the approach is to have all signal connections arranged about the peripheral region.

It will be appreciated that the technique of FIG. 7 may readily be combined with that of FIGS. 5 and 6.

The nature of where the conductive track is a security track will now be described in more detail. In this approach, the critical nature of the conductive track is indirect.

The interference with a security track in itself does not disrupt the normal operation of the integrated circuit.

Instead, as shown in FIG. 7, the security track 86 forms part of a security mechanism 82 which reacts to a disruption of the security track. The security mechanism comprises the security track and connections between the security track and the integrated circuit 2 and circuitry 87, 88, 89 within the integrated circuit which monitors for an attack on the integrity of the security track. The security mechanism 82 does not generally interfere in the operation of the integrated circuit 2 unless and until it detects an attack on the integrity of the security track 86.

Figure 8:
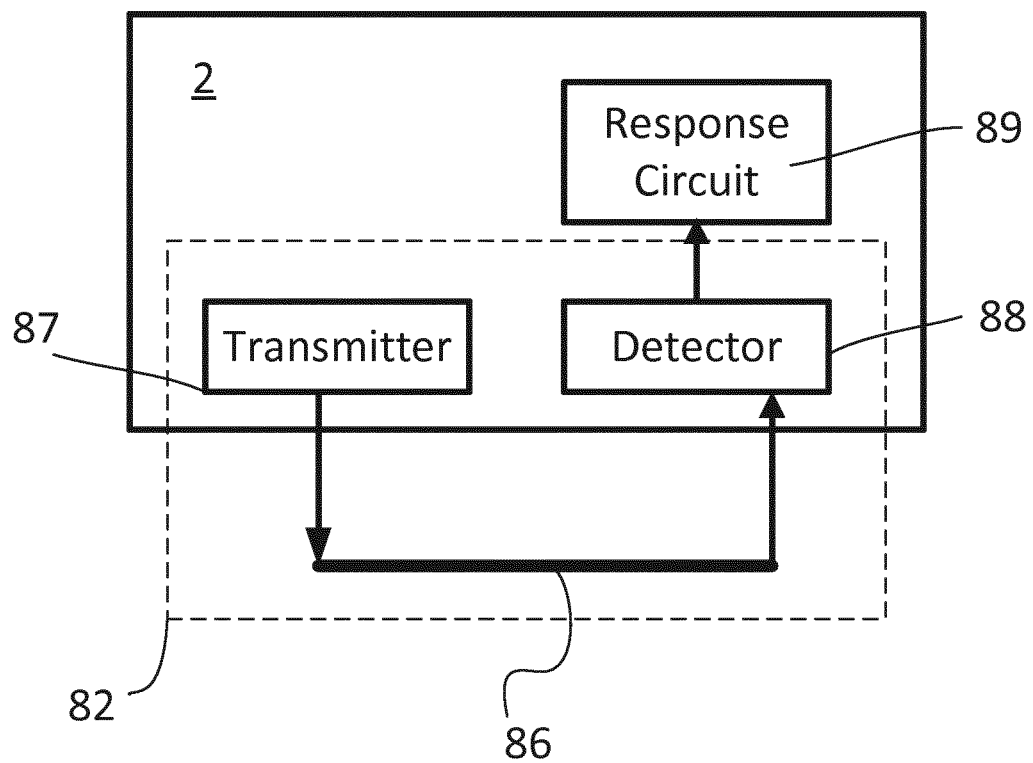
FIG. 8 is a security mechanism which may be employed with the arrangements of FIGS. 4 to 7.

In the FIG. 8, the security mechanism 82 employs a transmitter 87 to direct a signal along the security track 86. This signal may be a voltage, a current or s dynamic signal such as a clock or digital stream of bits. Equally, it may be a DC or an AC voltage or current. A detection circuit 88 monitors for any change to the signal at the opposite end of the security track to the transmitter. The detection of a change to the signal by the detection circuit would result in counter measures by a response circuit 89 preventing the normal operation of the chip. The countermeasures may comprise resetting or disabling all or part of the functionalities of the chip. These counter measures may include disabling the functioning of the integrated circuit or erasing the contents of memory on the integrated circuit or both.

A security track may be considered as a conductive track which is electrically connected, for example using a combination of tracks, vias and wire-bonds, to at least two terminals of the integrated circuit. This allows a first connection at one end of the security track to a first terminal and in turn to the transmitter of the security mechanism. The connection to a second terminal is provided at the opposite end of the security track. The second terminal in turn provides a connection to the detector of the security mechanism.

The security mechanism may be a passive shield or an active shield. In both instances, a signal is provided by a signal transmitter to a first end of the conductive track and the detection circuit is employed to monitor the opposite end of conductive track.

In the case of a passive shield, the transmitter and detection circuit may be configured to allow a detection in the change of the impedance of the conductive track. This change may be measured, for example, as a capacitance or as a resistance. Passive shields typically employ analog circuitry for the transmitter and detector.

In active shielding, sequences of bits (typically random) are injected at the start of the conductive track and subsequently tested at the other end by the detection circuit to check whether the sequence of bits arrive unaltered after their journey along the security track.

It will be appreciated that a variety of different techniques are available which may be selected to advantage to implement the security mechanism as a passive or active shield.

The words comprises/comprising when used in this specification are to specify the presence of stated features, integers, steps or components but does not preclude the presence or addition of one or more other features, integers, steps, components or groups thereof.

The invention claimed is:

1. A chip, comprising:
a substrate having a first surface and a second surface opposite the first surface;
an integrated circuit mounted on a landing zone on the first surface of the substrate, the landing zone defining a landing zone region of the substrate being surrounded by a peripheral region of the substrate;
a plurality of electrical contacts provided about the first surface in the peripheral region;
a plurality of wire-bonds providing electrical connections between the integrated circuit and the plurality of electrical contacts;
a plurality of solder ball connections provided in the peripheral region on the second surface;
a plurality of connections provided in the substrate to connect the electrical contacts on the first surface with the solder ball connections on the second surface,
wherein the substrate comprises at least one conductive track routed through the landing zone region of the substrate, and the at least one conductive track provides an electrical connection to the integrated circuit required for normal operation of the integrated circuit,
the chip is configured such that an alteration in the at least one conductive track prevents operation of the integrated circuit,
the at least one conductive track is electrically connected to at least one solder ball, and the at least one solder ball is positioned centrally under the landing zone region of the substrate,
the at least one conductive track is a security track forming part of a security mechanism, and the security mechanism is configured to detect an interference with an integrity of the security track and, in response, to enable at least one countermeasure,
the security mechanism includes a signal transmitter on the integrated circuit to provide a signal to a first end of the security track, and a detection circuit connected to a second end of the security track to detect an alteration to the signal, and
the security mechanism further comprises a response circuit responsive to the detection circuit to reset or disable all or part of functionalities of the chip caused by the at least one countermeasure.

2. The chip according to claim 1, wherein a ground plane is provided as a layer of conductive material in the landing zone region of the substrate, and the at least one conductive track follows an isolated path partitioning the ground plane.

3. The chip according to claim 1, wherein a power plane is provided as a layer of conductive material in the landing zone region of the substrate, and the at least one conductive track follows an isolated path partitioning the power plane.

4. A method for protecting a wire-bond packaged ball grid array chip against alterations, comprising:
forming a substrate having a first surface and a second surface opposite the first surface having a landing zone for an integrated circuit, the landing zone defining a landing zone region of the substrate, the forming of the substrate including providing a plurality of contacts about the first surface in a peripheral region, the peripheral region surrounding the landing zone region;
mounting the integrated circuit on the landing zone;
connecting a plurality of wire-bonds between the integrated circuit and the plurality of contacts; and
providing a plurality of solder hall connections on a peripheral region of the second surface,
wherein the step of forming the substrate further comprises providing a plurality of connections in the substrate for connecting the electrical contacts on the first surface with the solder ball connections on the second surface;
the step of forming of the substrate further comprises routing at least one conductive track through the landing zone region of the substrate,
the at least one track provides an electrical connection to the integrated circuit required for the subsequent correct operation of the integrated circuit,
the chip is configured such that an alteration in the at least one conductive track prevents operation of the integrated circuit, the at least one conductive track is electrically connected to at least one solder ball, and the at least one solder ball is positioned centrally under the landing zone region of the substrate, the at least one conductive track is a security track, and the method further comprises providing a security mechanism including the security track, wherein the security mechanism is configured to detect an interference with the integrity of the security track and in response to enable at least one countermeasure, providing, by the security mechanism, a signal to a first end of the security track; and detecting an alteration to the signal at a second end of the security track and in response to detecting an alteration, resetting, or disabling all or part of the functions of the chip by the at least one countermeasure.

5. The method according to claim 4, wherein the method comprises the step of forming a layer of conductive material in the landing zone region of the substrate to act as a ground plane, and the at least one conductive track follows an isolated path partitioning the ground plane.

6. The method according to claim 5, further comprising providing a layer of conductive material in the landing zone region of the substrate to act as a power plane and the at least one track follows an isolated path partitioning the power plane.

\* \* \* \* \*